US011476438B2

(12) United States Patent
Lee et al.

(10) Patent No.: US 11,476,438 B2
(45) Date of Patent: Oct. 18, 2022

(54) DISPLAY MODULE INCLUDING A STEP-DIFFERENCE COMPENSATION FILM AND A METHOD OF MANUFACTURING A DISPLAY DEVICE INCLUDING THE SAME

(71) Applicant: SAMSUNG DISPLAY CO., LTD., Yongin-si (KR)

(72) Inventors: Kang-Yong Lee, Seoul (KR); Woosong Kim, Suwon-si (KR); Kyungjun Park, Hwaseong-si (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 364 days.

(21) Appl. No.: 16/551,262

(22) Filed: Aug. 26, 2019

(65) Prior Publication Data
US 2020/0176705 A1 Jun. 4, 2020

(30) Foreign Application Priority Data
Dec. 4, 2018 (KR) .................. 10-2018-0154335

(51) Int. Cl.
*H01L 51/52* (2006.01)
*B32B 5/14* (2006.01)
*B32B 7/14* (2006.01)

(52) U.S. Cl.
CPC ............ *H01L 51/5237* (2013.01); *B32B 5/14* (2013.01); *B32B 7/14* (2013.01); *B32B 2457/20* (2013.01); *Y10T 428/24959* (2015.01)

(58) Field of Classification Search
CPC ......... B32B 5/14; B32B 7/14; B32B 2457/20; H04M 1/0266; H04M 1/026; H05K 5/03; H05K 2201/10128; H05K 1/111; G02B 1/14
See application file for complete search history.

(56) References Cited

U.S. PATENT DOCUMENTS 8,466,613 B2  6/2013 Yee
9,961,789 B2  5/2018 Kim et al.
(Continued)

FOREIGN PATENT DOCUMENTS

KR  10-0730081  6/2007
KR  10-1080686  11/2011
(Continued)

*Primary Examiner* — Alicia J Sawdon
(74) *Attorney, Agent, or Firm* — F. Chau & Associates, LLC

(57) ABSTRACT

According to an exemplary embodiment of the present invention, a display module is provided including a display panel comprising a pixel configured to display an image on a front surface of the display panel. A cover panel is disposed on a rear surface of the display panel. An adhesive film is disposed on the cover panel, and the adhesive film exposes a first portion of the cover panel. A protective film is disposed on the cover panel, and the adhesive film is disposed between the protective film and the cover panel. A step-difference compensation film is disposed between the cover panel and the protective film. The step-difference compensation film covers the first portion of the cover panel exposed by the adhesive film and the step difference compensation film has a thickness substantially equal to a thickness of the adhesive film.

17 Claims, 9 Drawing Sheets

(56) References Cited

U.S. PATENT DOCUMENTS

| | | | |
|---|---|---|---|
| 2013/0108806 A1* | 5/2013 | Han | B32B 27/36 |
| | | | 428/1.1 |
| 2013/0316112 A1* | 11/2013 | Leonhard | B32B 7/12 |
| | | | 428/38 |
| 2013/0335348 A1 | 12/2013 | Nam et al. | |
| 2018/0203483 A1 | 7/2018 | Kwak et al. | |
| 2018/0366679 A1* | 12/2018 | Kim | H01L 51/5237 |

FOREIGN PATENT DOCUMENTS

| | | |
|---|---|---|
| KR | 10-2017-0059066 | 5/2017 |
| KR | 10-2018-0085627 | 7/2018 |

* cited by examiner

DISPLAY MODULE INCLUDING A STEP-DIFFERENCE COMPENSATION FILM AND A METHOD OF MANUFACTURING A DISPLAY DEVICE INCLUDING THE SAME

CROSS-REFERENCE TO RELATED APPLICATION

This U.S. non-provisional patent application claims priority under 35 U.S.C. § 119 to Korean Patent Application No. 10-2018-0154335, filed on Dec. 4, 2018, the entire disclosure of which is incorporated by reference herein in its entirety.

TECHNICAL FIELD

The present disclosure provided herein relates to a display module and a method of manufacturing a display device including the same, and more particularly, to a display module including a step-difference compensation film a method of manufacturing a display device including the same.

DISCUSSION OF RELATED ART

A display module for displaying an image may include a display panel and a cover panel. Components may be added to the display module, and/or components of the display module may be coupled to each other by a pressing process during manufacture.

A space may occur in the display module due to a step difference between the components which may introduce complications in the pressing process. Defects may consequently occur because of a difference in refractive index between the display panel and an air layer filling the space as well as unequal pressing forces.

SUMMARY

The present disclosure provides for a display module which includes a step-difference compensation film capable of compensating for a step difference in a pressing process for coupling components of the display module, and a method of manufacturing a display device including the same.

According to an exemplary embodiment of the present invention, a display module is provided including a display panel comprising a pixel configured to display an image on a front surface of the display panel. A cover panel is disposed on a rear surface of the display panel. An adhesive film is disposed on the cover panel, and the adhesive film exposes a first portion of the cover panel. A protective film is disposed on the cover panel, and the adhesive film is disposed between the protective film and the cover panel. A step-difference compensation film is disposed between the cover panel and the protective film. The step-difference compensation film covers the first portion of the cover panel exposed by the adhesive film and the step difference compensation film has a thickness substantially equal to a thickness of the adhesive film.

According to an exemplary embodiment of the present invention, an adhesive strength of the step-difference compensation film to the cover panel is less than an adhesive strength of the step-difference compensation film to the protective film.

According to an exemplary embodiment of the present invention, the step-difference compensation film includes a first adhesive layer disposed on the protective film, a second adhesive layer disposed on the cover panel, and an intermediate layer disposed between the first adhesive layer and the second adhesive layer. The adhesive strength of the step-difference compensation film to the protective film is defined as an adhesive strength of the first adhesive layer to the protective film, and an adhesive strength of the second adhesive layer of the step-difference compensation film to the cover panel is less than the adhesive strength of the first adhesive layer of the step-difference film to the protective film.

According to an exemplary embodiment of the present invention, the adhesive film includes a first adhesive film layer disposed on the protective film, a second adhesive film layer disposed on the cover panel, and an intermediate film disposed between the first adhesive film layer and the second adhesive film layer. The adhesive strength of the second adhesive layer of the step-difference compensation film to the cover panel is less than an adhesive strength of the second adhesive film layer of the adhesive film to the cover panel.

According to an exemplary embodiment of the present invention, the adhesive strength of the first adhesive layer of the step-difference compensation film to the protective film is greater than an adhesive strength of the first adhesive film layer of the adhesive film to the protective film.

According to an exemplary embodiment of the present invention, the intermediate layer is provided in plural, and the step-difference compensation film further comprises an additional adhesive layer disposed between the intermediate layers.

According to an exemplary embodiment of the present invention, a surface of the step-difference compensation film and a surface of the adhesive film which face the protective film are coplanar with each other.

According to an exemplary embodiment of the present invention, the adhesive film includes at least one opening exposing a second portion of the cover panel which is different from the first portion of the cover panel.

According to an exemplary embodiment of the present invention, the step-difference compensation film comprises a first film covering the first portion of the cover panel, and a second film covering the second portion of the cover panel.

According to an exemplary embodiment of the present invention, the adhesive film includes a pressure sensitive adhesive (PSA), an optical clear adhesive (OCA), and/or an optical clear resin (OCR).

According to an exemplary embodiment of the present invention, the cover panel includes a heat dissipation layer, an impact absorbing layer, or a light blocking layer.

According to an exemplary embodiment of the present invention, the first portion of the cover panel exposed by the adhesive film is the heat dissipation layer, the impact absorbing layer or the light blocking layer.

According to an exemplary embodiment of the present invention, a display module is provided including a display panel including a pixel configured to display an image on a front surface of the display panel. A cover panel is disposed on a rear surface of the display panel. An adhesive film is disposed on a rear surface of the cover panel and exposes a first portion of the cover panel. A protective film disposed under the adhesive film. A step-difference compensation film is disposed between the cover panel and the protective film and covering the first portion of the cover panel exposed by the adhesive film. An adhesive strength of the step-difference compensation film to the cover panel is less than an adhesive strength of the step-difference compensation film to the protective film.

According to an exemplary embodiment of the present invention, a thickness of the step-difference compensation film ranges from 90% to 110% of a thickness of the adhesive film.

According to an exemplary embodiment of the present invention, the adhesive film includes at least one opening exposing a second portion of the cover panel which is different from the first portion of the cover panel. The step-difference compensation film covers the second portion of the cover panel.

According to an exemplary embodiment of the present invention, the adhesive film includes a first adhesive film layer in contact with the protective film, a second adhesive film layer in contact with the cover panel, and an intermediate film disposed between the first adhesive film layer and the second adhesive film layer. The adhesive strength of the step-difference compensation film to the cover panel is less than an adhesive strength of the second adhesive film layer of the adhesive film to the cover panel.

According to an exemplary embodiment of the present invention, the adhesive strength of the step-difference compensation film to the protective film is greater than an adhesive strength of the first adhesive film layer of the adhesive film to the protective film.

According to an exemplary embodiment of the present invention, a method of manufacturing a display device is provided including providing an initial display module. The initial display panel module includes a cover panel, an adhesive film exposing a first portion of the cover panel and coupled to the cover panel, a step-difference compensation film covering the first portion of the cover panel exposed by the adhesive film, and a protective film covering the adhesive film and the step-difference compensation film. The initial display module is pressed to form a preliminary display module. A display panel is coupled to the preliminary display module to form a display module. The protective film and the step-difference compensation film are removed from the display module to form a display unit.

According to an exemplary embodiment of the present invention, a cover window and a cover case are coupled to the display unit.

According to an exemplary embodiment of the present invention, the cover case is coupled to the display unit by the adhesive film.

BRIEF DESCRIPTION OF THE FIGURES

The above and other aspects and features of the present disclosure will be more clearly understood from the following detailed description taken in conjunction with the accompanying drawings, in which.

DETAILED DESCRIPTION OF THE EMBODIMENTS

Figure 1:
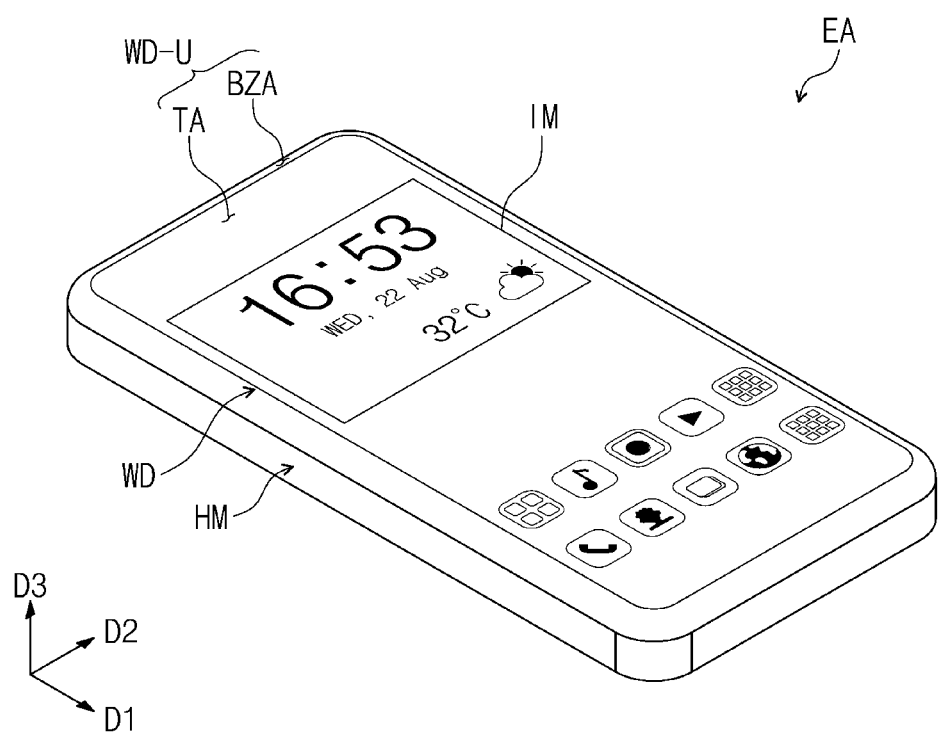
FIG. 1 is a perspective view illustrating a display device according to an exemplary embodiment of the present invention.

The present invention will be described more fully hereinafter with reference to the accompanying drawings, in which various exemplary embodiments are shown. The present invention may, however, be embodied in many different forms, and should not be construed as limited to the exemplary embodiments set forth herein. Like reference numerals may refer to like elements throughout the specification and drawings. Also, in the drawings the thickness, ratio, and the dimensions of elements may be exaggerated to facilitate description of technical contents.

It will be understood that when an element such as a layer, region or substrate is referred to as being "on," "connected to", or "coupled to" another element, it may be directly disposed on/connected to/coupled to the other element or intervening elements may be present therebetween. In contrast, the term "directly" means that there are no intervening elements.

Figure 2:
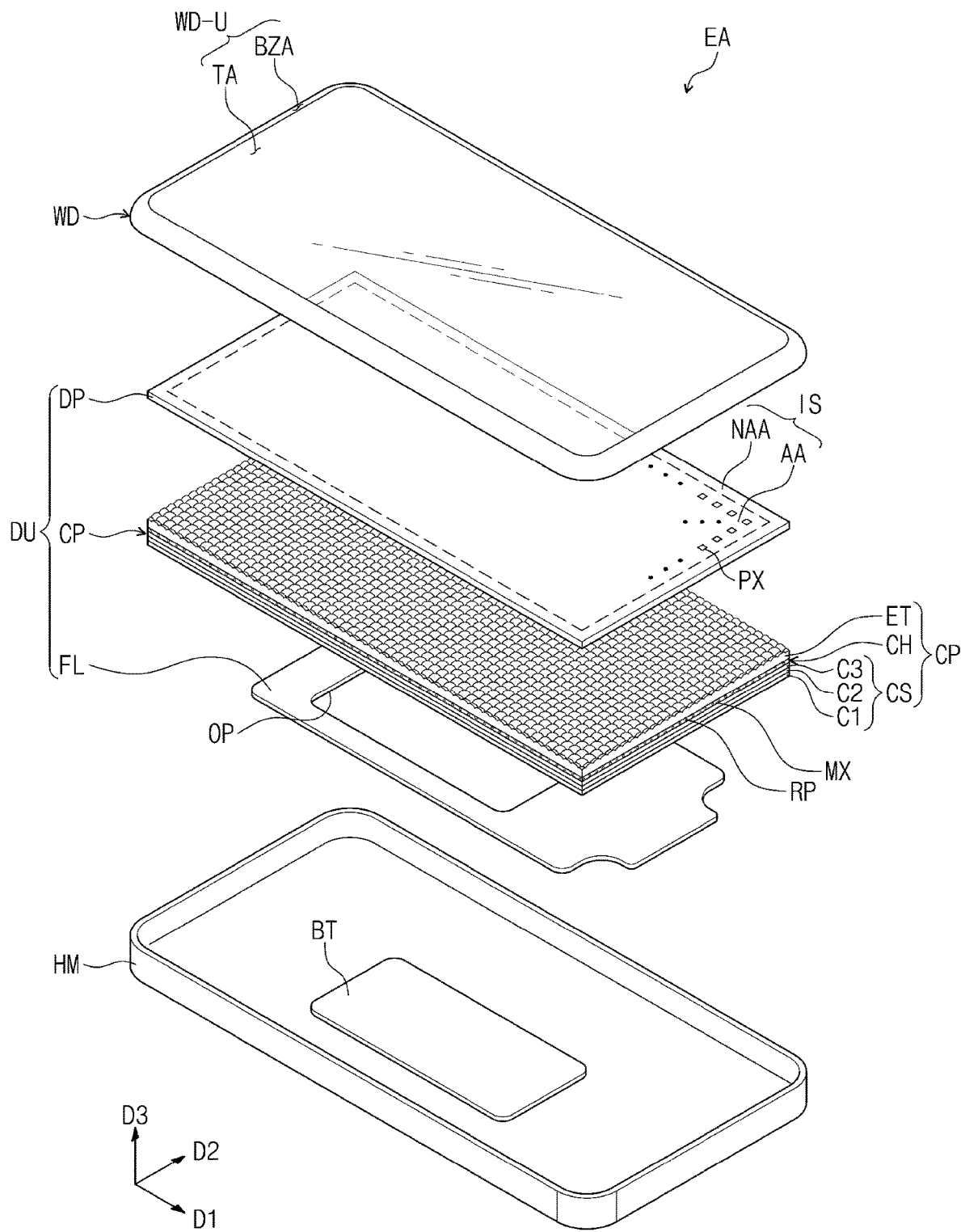
FIG. 2 is an exploded perspective view illustrating a display device according to an exemplary embodiment of the present invention.
Figure 3:
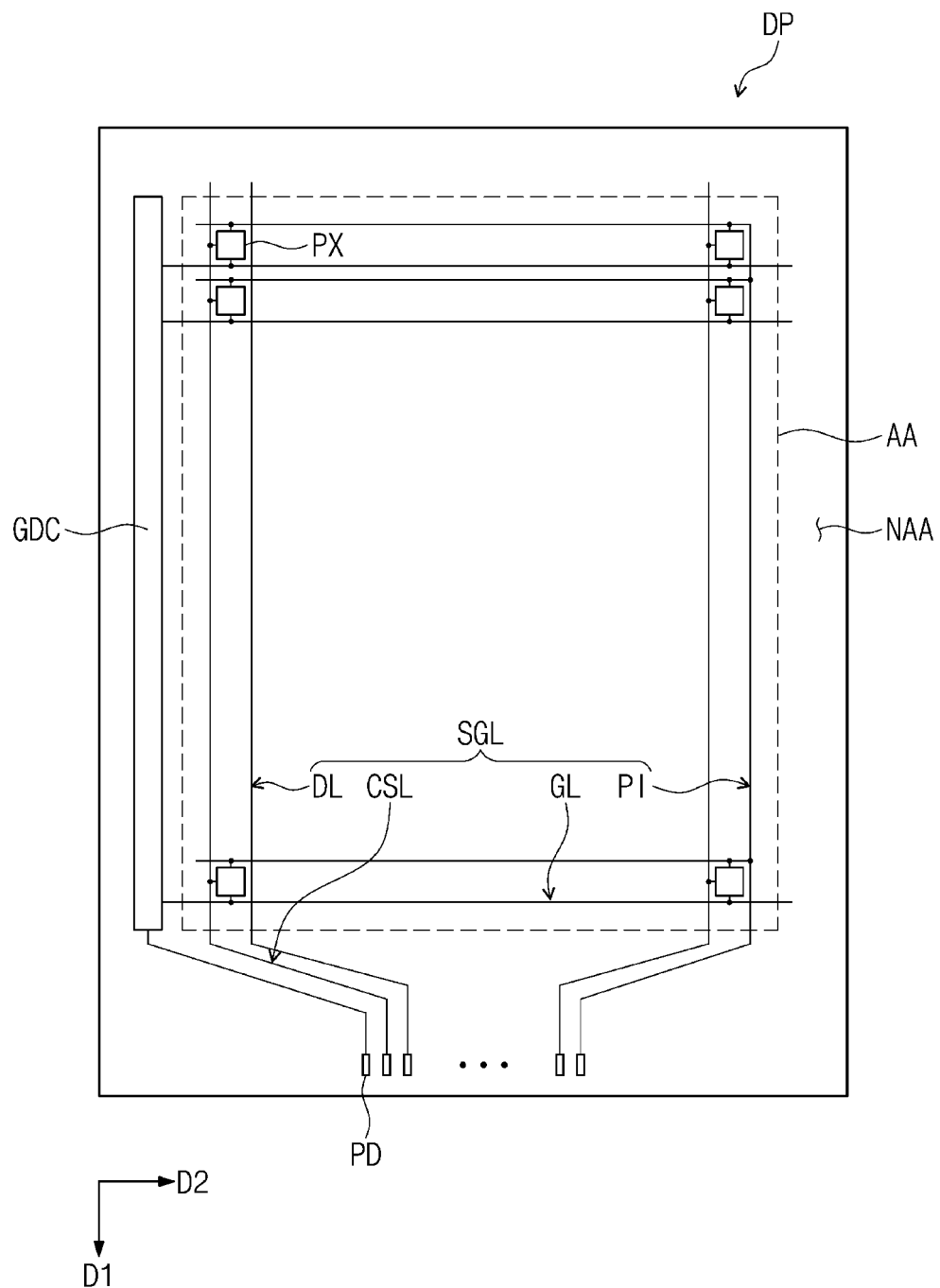
FIG. 3 is a plan view illustrating a display panel according to an exemplary embodiment of the present invention.
Figure 4:
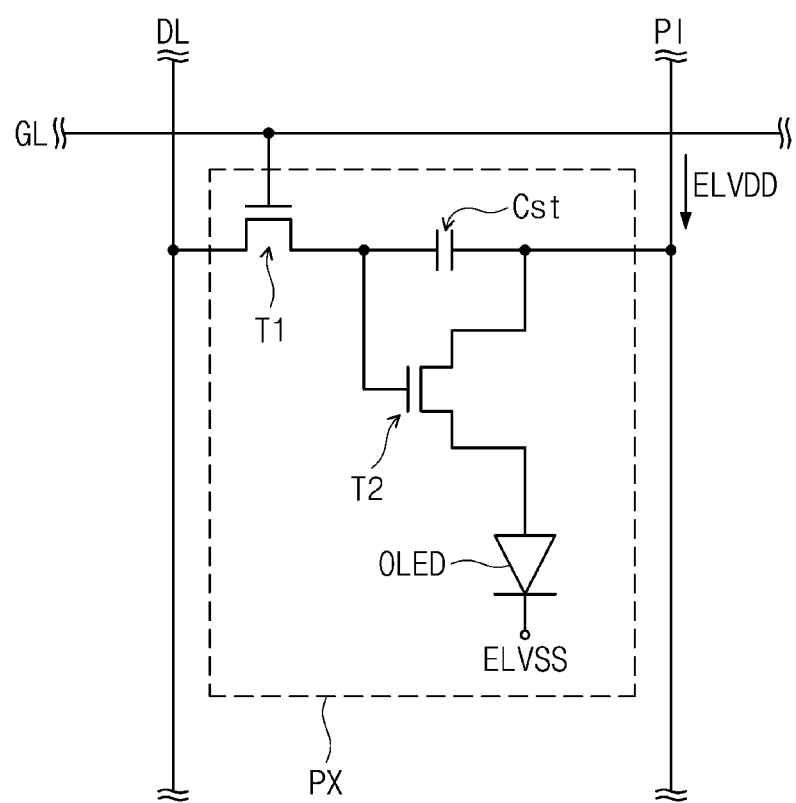
FIG. 4 is an equivalent circuit diagram of a pixel according to an exemplary embodiment of the present invention.

FIG. 1 is a perspective view illustrating a display device according to an exemplary embodiment of the present invention. FIG. 2 is an exploded perspective view illustrating a display device according to an exemplary embodiment of the present invention. FIG. 3 is a plan view illustrating a display panel according to an exemplary embodiment of the present invention. FIG. 4 is an equivalent circuit diagram of a pixel according to an exemplary embodiment of the present invention. Hereinafter, a display device according to an exemplary embodiment of the present invention will be described with reference to FIGS. 1 to 4.

Referring to FIGS. 1 and 2, a display device EA may include a cover window WD, a display panel DP, a cover panel CP, an adhesive film FL, a power supply unit BT, and a cover case HM. The display panel DP, the cover panel CP and the adhesive film FL may collectively be referred to as a display unit DU. The display device EA may display an image IM on a plane defined by a first direction (e.g., a D1 direction) and a second direction (e.g., a D2 direction). The image IM displayed on the display device EA may be directed in a third direction (e.g., a D3 direction).

The cover window WD may include an optically transparent material. For example, the cover window WD may include glass and/or plastic. The cover window WD may have a single-layered or multi-layered structure. For example, the cover window WD may have a stack structure including a plurality of plastic films coupled to each other by an adhesive, or may have a stack structure which includes a glass substrate and/or a plastic film coupled to each other by an adhesive.

The cover window WD may have a front surface WD-U that is externally exposed. The image IM displayed on the display panel DP may be visible to the outside through the front surface WD-U. The front surface WD-U of the cover window WD may be divided into a transmission area TA and a bezel area BZA, when viewed in a plan view.

The transmission area TA may incident light externally to display the image IM. The transmission area TA may have a shape corresponding to a shape of an active area AA. For example, the transmission area TA may at least partially overlap the active area AA. The image IM displayed in the active area AA of the display panel DP may be visible to the outside through the transmission area TA.

A light transmittance of the bezel area BZA may be less than a light transmittance of the transmission area TA. The bezel area BZA may define a shape of the transmission area TA, for example, a substantially rectangular shape. The bezel area BZA may be adjacent to the transmission area TA and may at least partially surround the transmission area TA in a plan view.

The bezel area BZA may have a predetermined color. The bezel area BZA may at least partially cover a peripheral area NAA of the display panel DP to prevent the peripheral area NAA from being visible to the outside. However, embodiments of the present invention are not limited thereto. In an exemplary embodiment of the present invention, the bezel area BZA may be omitted in the cover window WD.

The display panel DP may display the image IM on its front surface IS. The front surface IS may include the active area AA and the peripheral area NAA. The image IM may be displayed in the active area AA. The peripheral area NAA may be adjacent to the active area AA.

The cover panel CP may include a light blocking layer ET, an impact absorbing layer CH and a heat dissipation layer CS. The impact absorbing layer CH may include a matrix layer MX and a plurality of pores RP. The plurality of pores RP may be dispersed in the matrix layer. The heat dissipation layer CS may further include a plurality of stacked films. For example, the heat dissipation layer CS may include a first layer C1, a second layer C2 and a third layer C3. The first layer C1 may be disposed on the adhesive film FL. The adhesive film FL may include an opening OP. The third layer C3 may be disposed on the impact absorbing layer CH. At least a portion of the display unit DU may be housed in the cover case HM. The cover case HM may have a rim with a height that extends in the third direction (e.g., the D3 direction) and a central portion (e.g., a surface defined by the D2 and D1 directions). The central portion of the cover case HM may include a power supply unit BT disposed thereon. The adhesive film FL may be disposed on the planar surface of the cover case HM and the opening(s) OP may expose various components, such as, the power supply unit BT. The opening part OP may have a shape that corresponds to a shape of the power supply unit BT.

The cover panel CP may be disposed on a rear surface of the display panel DP. The cover panel CP may include the light blocking layer ET, the impact absorbing layer CH, and/or the heat dissipation layer CS.

The light blocking layer ET may be disposed closest to the display panel DP. The light blocking layer ET may inhibit or prevent components disposed on the rear surface of the display panel DP from being visible through the active area AA. Thus, the light blocking layer ET may block light outputted from the rear surface of the display panel DP.

The light blocking layer ET, according to an exemplary embodiment of the present invention, may include a plurality of protrusions protruding in the third direction (e.g., the D3 direction). The shape of the protrusions may be formed by embossing. Since the light blocking layer ET includes the protrusions having the embossed shape and protruding toward the display panel DP, it is possible to effectively prevent the components disposed on the rear surface of the display panel DP from being visible to the outside. Cross-sectional shapes of the protrusions may be, for example, semicircular shapes. The cross-sectional shapes of the protrusions may also be triangular shapes. However, the present invention is not limited thereto, and the shape of the embossed protrusions may be variously changed.

The impact absorbing layer CH may be disposed between the light blocking layer ET and the heat dissipation layer CS. The impact absorbing layer CH may have a porous structure and may be comprised of a material with a low modulus of elasticity relative to adjacent layers. For example, the impact absorbing layer CH may include synthetic resin foam. The impact absorbing layer CH may include a matrix layer MX and a plurality of pores RP. The plurality of pores RP may be dispersed throughout the matrix layer MX. The matrix layer MX may include a flexible material. For example, the matrix layer MX may include a synthetic resin. For example, the matrix layer MX may include acrylonitrile butadiene styrene copolymer (ABS), polyurethane (PU), polyethylene (PE), ethylene vinyl acetate (EVA), and/or polyvinyl chloride (PVC).

The plurality of pores RP may easily absorb an impact applied to the impact absorbing layer CH. Since the impact absorbing layer CH may have the porous structure described above, the plurality of pores RP may be defined in the impact absorbing layer CH. The plurality of pores RP may allow a shape of the impact absorbing layer CH to be easily deformed, and thus the elasticity of the impact absorbing layer CH may be increased. As a result, impact resistance of the cover panel CP may be increased. According to an exemplary embodiment of the present invention, the impact absorbing layer CH may include a plurality of synthetic resins. However, exemplary embodiments of the present invention are not limited thereto.

According to an exemplary embodiment of the present invention, the impact absorbing layer CH may be disposed on the rear surface of the display panel DP, and thus impact resistance of the display device EA may be increased.

The heat dissipation layer CS may include a plurality of layers. For example, the heat dissipation layer CS may include first, second and third layers C1, C2 and C3 which are sequentially stacked. The heat dissipation layer CS may effectively dissipate or discharge heat generated from the display panel DP.

The first layer C1 may include a polyimide (P1) film. The second layer C2 may include a metal or a black resin material, which has a low light transmittance. For example, the second layer C2 may be a sheet including chrome, a chrome/chrome oxide double layer, a carbon pigment, or graphite. The graphite may include carbon powder, and thus heat conductivity of the second layer C2 may be increased. The third layer C3 may be a sheet which includes a metal material (e.g., copper (Cu) or aluminum (Al)) having high heat conductivity. However, exemplary embodiments of the present invention are not limited thereto. The first and second layers C1 and C2 may be omitted, or a stacking order of the first to third layers C1, C2 and C3 may be changed. According to an exemplary embodiment of the present invention, the heat dissipation layer CS may be disposed on the rear surface of the display panel DP, and thus heat generated from the display panel DP may be easily dissipated or discharged to the outside.

However, the present invention is not limited to the above described exemplary embodiments of the present invention. For example, the light blocking layer ET, the heat dissipation layer CS and/or the impact absorbing layer CH may be omitted, or a plurality of the layers may be provided as a single layer (e.g., integrally formed).

The adhesive film FL may be disposed on a surface of the cover panel CP (e.g., an underside opposite to the display panel DP). The adhesive film FL may be disposed between the cover panel CP and the cover case HM and may couple the cover panel CP and the cover case HM.

At least one opening OP may be defined in the adhesive film FL. The opening OP may overlap the power supply unit BT adhered to the cover case HM. The power supply unit BT may be inserted into the opening OP of the adhesive film FL.

For example, the adhesive film FL may be formed of a pressure sensitive adhesive (PSA), an optical clear adhesive (OCA), or an optical clear resin (OCR).

The adhesive film FL may possess a closed-line rectangular shape with four sides in a plan view. A first protruding portion may extend from one side surface and a second protruding portion may extend from a second side surface. For example, the first protruding portion may extend in the second direction (e.g., the D2 direction) from a long side of the adhesive film FL, and a second protruding portion may extend from a short side of the adhesive film in the first direction (e.g., the D1 direction), when viewed in a plan view. However, the shape of the adhesive film FL is not limited to the exemplary embodiment described above.

According to an exemplary embodiment of the present invention, the adhesive film FL may have a plurality of openings exposing the cover panel CP and may accommodate various components of the display device EA disposed between the cover case HM and the cover panel CP. According to an exemplary embodiment of the present invention, the opening OP may be omitted, and the adhesive film FL may have a smaller area than that of the cover panel CP to expose a portion of the cover panel CP. For example, when an adhesive film FL does not feature an opening OP, the adhesive film FL may have a substantially similar shape to exemplary embodiments described herein, but might not have a closed line shape (e.g., at least one of the sides in a plan view may be omitted), or the area otherwise occupied by the opening part OP may be filled in.

The power supply unit BT may supply power necessary for overall operations of the display device EA. The power supply unit BT may include a battery. The power supply unit BT may be coupled to the display panel DP and other electronic module of the display device EA through boards.

The cover case HM may be coupled to the cover window WD. The cover case HM may provide a rear surface of the display device EA. The cover case HM may be coupled to the cover window WD to provide an inner space. The components of the display unit DU may be received in the inner space. The cover case HM may include a material having a predetermined rigidity. For example, the cover case HM may include a plurality of frames and/or plates, which are formed of glass, plastic, and/or a metal. The cover case HM may stably protect components of the display device EA received in the inner space from external impact.

Referring to FIGS. 3 and 4, the display panel DP may include a plurality of pixels PX. Each of the pixels PX may emit light in response to receiving an electrical signal. The light emitted by the pixels PX may create the image IM.

The display panel DP may include the active area AA in which the pixels PX are disposed, and the peripheral area NAA adjacent to the active area AA which might not emit light. According to an exemplary embodiment of the present invention, the peripheral area NAA may have a closed line shape (e.g., a loop) at least partially surrounding the active area AA.

The display panel DP may include a driving circuit GDC, a plurality of signal lines SGL, the plurality of pixels PX, and a plurality of pads PD. The pixels PX may be disposed in the active area AA. Each of the pixels PX may include an organic light emitting element (OLED) and a pixel driving circuit connected to the OLED.

The driving circuit GDC may include a scan driving circuit. The scan driving circuit may generate a plurality of scan signals and may sequentially output the scan signals to a plurality of scan lines GL to be described below. The scan driving circuit may further output other control signals to the pixel driving circuits of the pixels PX. The driving circuit GDC may be formed during the same process as the pixel driving circuits of the pixels PX.

The signal lines SGL may include scan lines GL, data lines DL, power lines P1, and a control signal line CSL. Each of the scan lines GL may be connected to corresponding ones of the pixels PX, and each of the data lines DL may be connected to corresponding pixels PX. The power lines PI may be connected to the pixels PX at a first end and to a respective pad PD at a second end. The control signal line CSL may provide control signals to the scan driving circuit.

The signal lines SGL may be connected to a circuit board. The signal lines SGL may be connected to a timing control circuit mounted on the circuit board in the form of an integrated chip. However, embodiments of the present invention are not limited thereto. For example, according to an exemplary embodiment of the present invention, the integrated chip may be disposed in the peripheral area NAA and may be connected to the signal lines SGL.

The pads PD may be connected to corresponding signal lines SGL and may be connected to a flexible circuit board on which driving chips are mounted. Each of the signal lines SGL may transmit/receive an electrical signal to/from the flexible circuit board through a corresponding one of the pads PD.

FIG. 4 illustrates one scan line GL, one data line DL, the power line P1, and the pixel PX connected to the scan line GL, the data line DL and the power line P1. However, the configuration of the pixel PX is not limited thereto but may be variously modified.

The pixel PX may include a first transistor T1 (e.g., a switching transistor), a second transistor T2 (e.g., a driving transistor) and a capacitor Cst which constitute the pixel driving circuit for driving an organic light emitting element OLED. The second transistor T2 may be provided with a first power source voltage ELVDD through the power line P1, and the organic light emitting element OLED may be provided with a second power source voltage ELVSS. The second power source voltage ELVSS may be lower than the first power source voltage ELVDD.

The first transistor T1 may output a data signal, applied to the data line DL, in response to a scan signal applied to the scan line GL. The capacitor Cst may be charged with a voltage corresponding to the data signal received from the first transistor T1. The second transistor T2 may be connected to the organic light emitting element OLED. The second transistor T2 may control a driving current, flowing through the organic light emitting element OLED, in response to the amount of charge stored in the capacitor Cst.

The equivalent circuit is illustrated as an example of the pixel PX, and embodiments of the present invention are not limited thereto. The pixel PX may further include a plurality of transistors and/or may include two or more capacitors. In an exemplary embodiment, the organic light emitting element OLED may be connected between the power line P1 and the second transistor T2.

Figure 5:
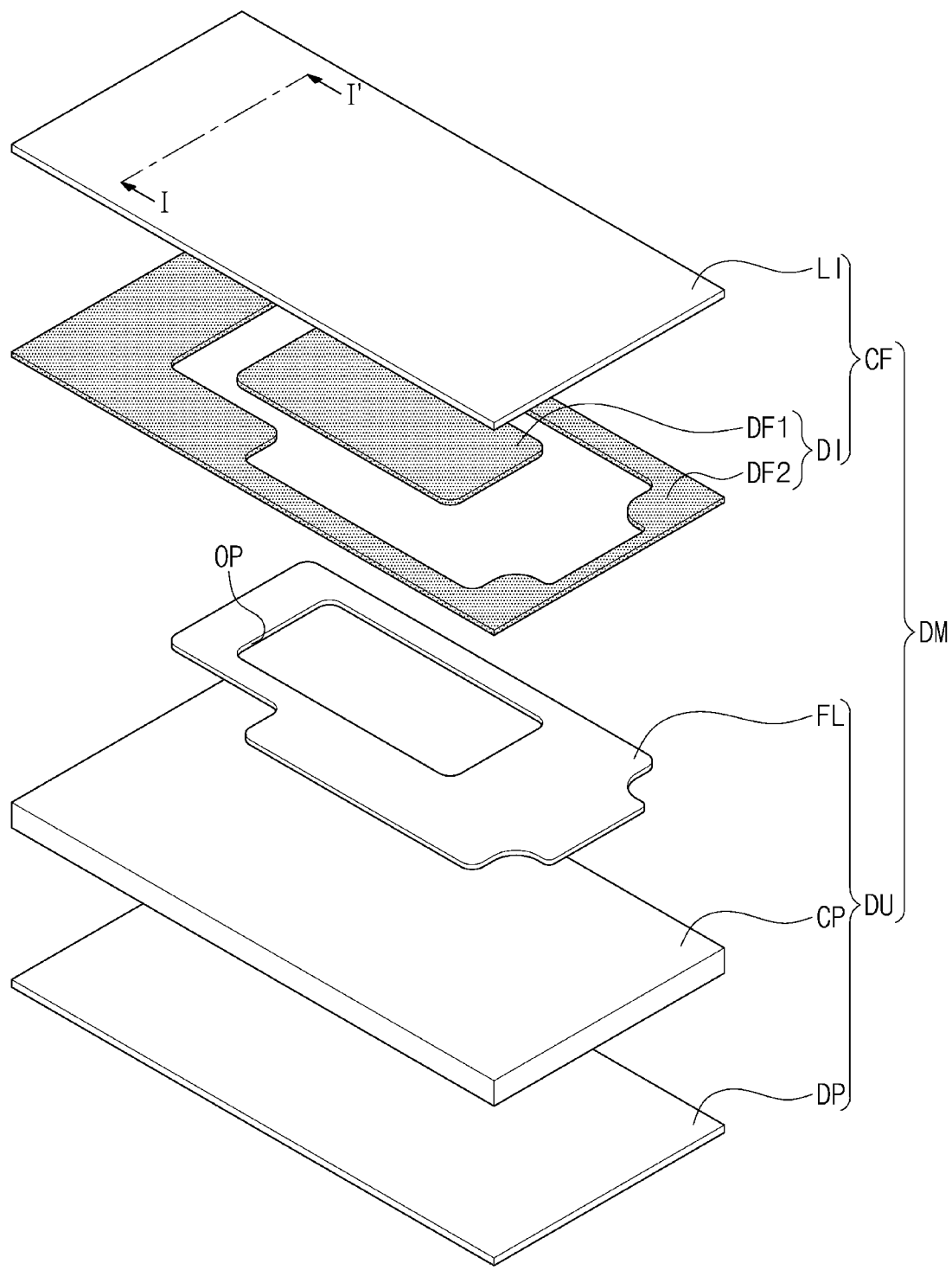
FIG. 5 is an exploded perspective view illustrating a display module according to an exemplary embodiment of the present invention.
Figure 6:
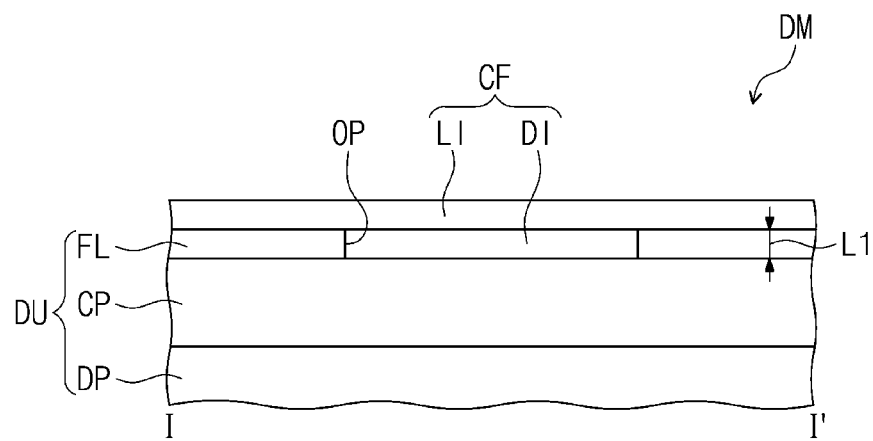
FIG. 6 is a cross-sectional view taken along a line I-I' of FIG. 5 according to an exemplary embodiment of the present invention.
Figure 7:
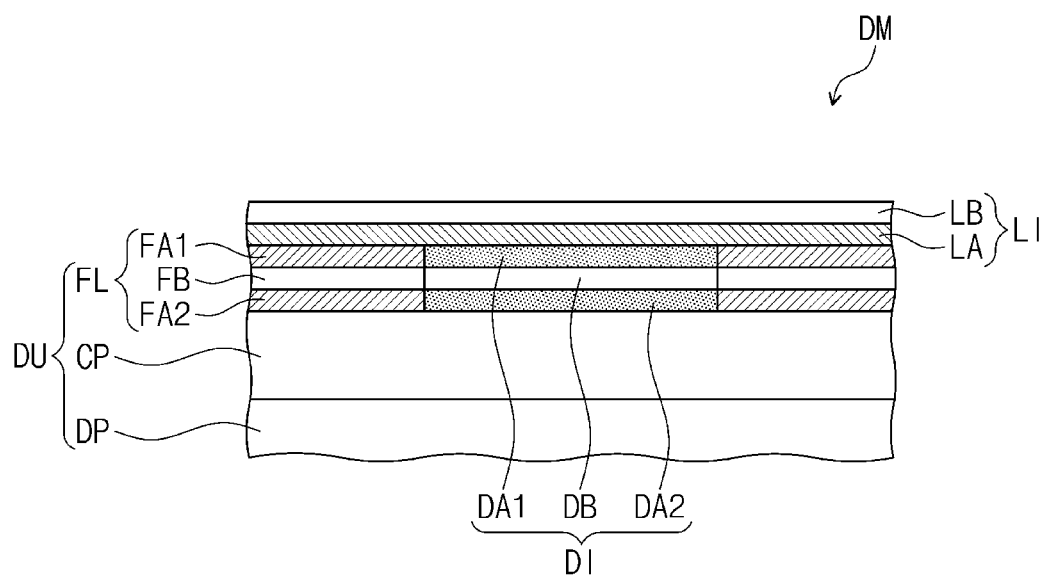
FIG. 7 is a cross-sectional view illustrating components of a display module according to an exemplary embodiment of the present invention.

FIG. 5 is an exploded perspective view illustrating a display module according to an exemplary embodiment of the present invention. FIG. 6 is a cross-sectional view taken along a line I-I' of FIG. 5 to illustrate a display module according to an exemplary embodiment of the present invention. FIG. 7 is a cross-sectional view illustrating components of a display module according to an exemplary embodiment of the present invention.

Referring to FIG. 5, a display module DM according to an exemplary embodiment of the present invention may include a display unit DU and a film unit CF. According to an exemplary embodiment of the present invention, the display unit DU may include the display panel DP, the cover panel CP, and the adhesive film FL. The display unit DU may be the same as the display unit DU described with reference to FIG. 2.

The film unit CF may include a step-difference compensation film DI and a protective film LI. The film unit CF may be a component coupled to the display unit DU before the cover window WD and the cover case HM are coupled to the display unit DU. The film unit CF may be coupled to the display unit DU to prevent the display unit DU from being damaged in a process of receiving, transferring or securing the display unit DU.

In addition, in a pressing process for coupling the components of the cover panel CP, the step-difference compensation film DI may compensate for a space which may occur by a step difference between the adhesive film FL and the cover panel CP, and thus uniform pressure may be applied to the cover panel CP.

Furthermore, it is possible to prevent external light from being reflected due to a difference in refractive index between the display panel DP and an air layer filling the space.

The adhesive film FL may be coupled to the cover panel CP and at least partially expose the cover panel CP. For example, an area (e.g., a planar area viewed in a plan view) of the cover panel CP may be greater than an area of the adhesive film FL. For example, the adhesive film FL may at least partially expose a portion of the cover panel CP outside the adhesive film FL, and the opening OP defined in the adhesive film FL may expose another portion of the cover panel CP which is spaced apart from the portion of the cover panel CP. The step-difference compensation film DI may have a shape that corresponds to internal and external edges of the adhesive film FL. For example, the step-difference compensation film DI may include a first film DF1 and a second film DF2. The first film DF1 may correspond to a shape of the first opening and the second film DF2 may correspond to the outer perimeter of the adhesive film FL, when viewed in a plan view.

According to an exemplary embodiment of the present invention, the step-difference compensation film DI may be integrally formed with the central portion of the cover case HM. For example, a plane of the central portion may be embossed to be substantially identical to a shape of the step-difference film DI, such that all of the display device components illustrated in FIG. 2 can be pressed at substantially the same time during manufacture with a decreased step-difference.

The step-difference compensation film DI may cover the portions of the cover panel CP which are exposed by the adhesive film FL. For example, the first film DF1 may be disposed in the opening OP to cover the cover panel CP exposed by the opening OP, and the second film DF2 may cover the cover panel CP exposed outside the adhesive film FL.

According to an exemplary embodiment of the present invention, a combined area of the adhesive film FL and the step-difference compensation film DI may greater than or equal to the area of the cover panel CP.

According to an exemplary embodiment of the present invention, the step-difference compensation film DI and/or the protection film LI may have a protrusion that extends in the first direction (e.g., the D1 direction), the second direction (e.g., the D2 direction), and/or the third direction (e.g., the D3 direction) beyond cover panel CP that may facilitate peeling or other means of subsequent separation during manufacture. For example, the adhesive film FL and/or the protection layer LI may be separable (e.g., along a D1 direction) such that halves can be removed by pulling on respective protrusions laterally in a direction substantially parallel to a plane of the cover panel CP (e.g., the D2 direction).

The shape of the step-difference compensation film DI is not limited to the exemplary embodiments illustrated. The shape of the step-difference compensation film DI may be variously modified depending on the shape of the adhesive film FL subject to the condition that the step-difference compensation film DI is coupled to the adhesive film FL to cover the cover panel CP exposed by the adhesive film FL. Thus, a substantially planar surface may be realized.

According to an exemplary embodiment of the present invention, the first film DF1 may be omitted when the power supply unit BT is disposed in the region of the opening OP. However, the present invention is not limited thereto.

According to an exemplary embodiment of the present invention, the first film DF1 may be disposed on a planar surface of the power supply unit BT, viewed in a plan view, with a height extending in the third direction (e.g., the D3 direction). The combined height of the power supply unit BT and the first film DF1 in the third direction (e.g., the D3 direction) may be substantially equal to a height in the third direction (e.g., the D3 direction) of the second film DF2. For example, the combined first film DF1 and the power supply unit BT may be coplanar with the second film DF2.

The protective film LI may be disposed on a combined surface of the adhesive film FL and the step-difference compensation film DI coupled to each other. An area of the protective film L may be equal to or greater than the combined area of the adhesive film FL and the step-difference compensation film DI.

According to an exemplary embodiment of the present invention, the power supply unit BT may be disposed between the adhesive film FL and the step-difference compensation film DI provided that the combined height of the power supply unit BT and the first film DI is substantially coplanar with the height of the second film DF2 in a third direction (e.g., the D3 direction).

The film unit CF may be removed during a process of coupling the cover window WD and the cover case HM to the display unit DU. Thus, the adhesive film FL of the display unit DU may be coupled to the cover case HM.

Referring to FIGS. 6 and 7, the cross-sectional views illustrate that the display unit DU and the film unit CF are coupled to each other. The step-difference compensation film D1 illustrated in FIGS. 6 and 7 may correspond to the first film DF1 disposed in the opening OP of FIG. 5.

According to an exemplary embodiment of the present invention, an adhesive strength (e.g., a tensile resistance, a shear resistance, and/or a peel resistance) of the step-difference compensation film DI to the cover panel CP may be less than an adhesive strength of the step-difference compensation film DI to the protective film LI.

According to an exemplary embodiment of the present invention, the step-difference compensation film DI may include a first adhesive layer DA1, a second adhesive layer DA2, and an intermediate layer DB. The intermediate layer DB may be disposed between the first adhesive layer DA1 and the second adhesive layer DA2. The first adhesive layer DA1 may be in contact with the protective film LI. The second adhesive layer DA2 may be in contact with the cover panel CP.

Thus, the adhesive strength (e.g., a tensile resistance, a shear resistance, and/or a peel resistance) of the step-difference compensation film DI to the protective film LI may be defined as an adhesive strength of the first adhesive layer DA1 to the protective film LI. In addition, the adhesive strength of the step-difference compensation film DI to the cover panel CP may be defined as an adhesive strength of the second adhesive layer DA2 to the cover panel CP. Thus, the adhesive strength of the second adhesive layer DA2 to the cover panel CP may be less than the adhesive strength of the first adhesive layer DA1 to the protective film LI.

The intermediate layer DB may have a predetermined thickness between the first adhesive layer DA1 and the second adhesive layer DA2, such that a thickness of the adhesive film FL may be substantially equal to a thickness of the step-difference compensation film DI. Thus, a surface of the step-difference compensation film DI and a surface of the adhesive film FL which faces the protective film LI may be coplanar with each other.

However, exemplary embodiments of the present invention are not limited thereto. Due to a tolerance in a process, the thickness of the step-difference compensation film D1 may range from 90% to 110% of the thickness of the adhesive film FL. In other words, the step-difference compensation film DI may have the thickness having a tolerance range of 10% of the thickness of the adhesive film FL.

According to an exemplary embodiment of the present invention, the first adhesive layer DA1 and the second adhesive layer DA2 may include silicon (Si)-based adhesive material. The intermediate layer DB may include epoxy, polyimide (PI), polyethylene terephthalate (PET), polycarbonate (PC), polyethylene (PE), and/or polyacrylate.

According to an exemplary embodiment of the present invention, the adhesive film FL may include a first adhesive film layer FA1, a second adhesive film layer FA2, and an intermediate film FB. The intermediate film FB may be disposed between the first adhesive film layer FA1 and the second adhesive film layer FA2. The first adhesive film layer FA1 may be in contact with the protective film LI. The second adhesive film layer FA2 may be in contact with the cover panel CP.

According to an exemplary embodiment of the present invention, the adhesive strength (e.g., a tensile resistance, a shear resistance, and/or a peel resistance) of the second adhesive layer DA2 to the cover panel CP may be less than an adhesive strength of the second adhesive film layer FA2 to the cover panel CP. In addition, the adhesive strength of the first adhesive layer DA1 to the protective film LI may be greater than an adhesive strength of the first adhesive film layer FA1 to the protective film LI.

According to an exemplary embodiment of the present invention, the adhesive strength (e.g., a tensile resistance, a shear resistance, and/or a peel resistance) of the step-difference compensation film DI to the cover panel CP may be less than the adhesive strength of the step-difference compensation film DI to the protective film LI, and the adhesive strength of the step-difference compensation film DI to the protective film LI may be greater than the adhesive strength of the adhesive film FL to the protective film LI. Thus, the film unit CF may be easily separated from the display unit DU in the process of removing the film unit CF.

The protective film LI according to an exemplary embodiment of the present invention may include a base film LB and an adhesive film layer LA. The adhesive force of the first adhesive layer DA1 to the protective film LI can be defined as the adhesive force of the first adhesive layer DA1 and the adhesive film layer LA.

Figure 8:
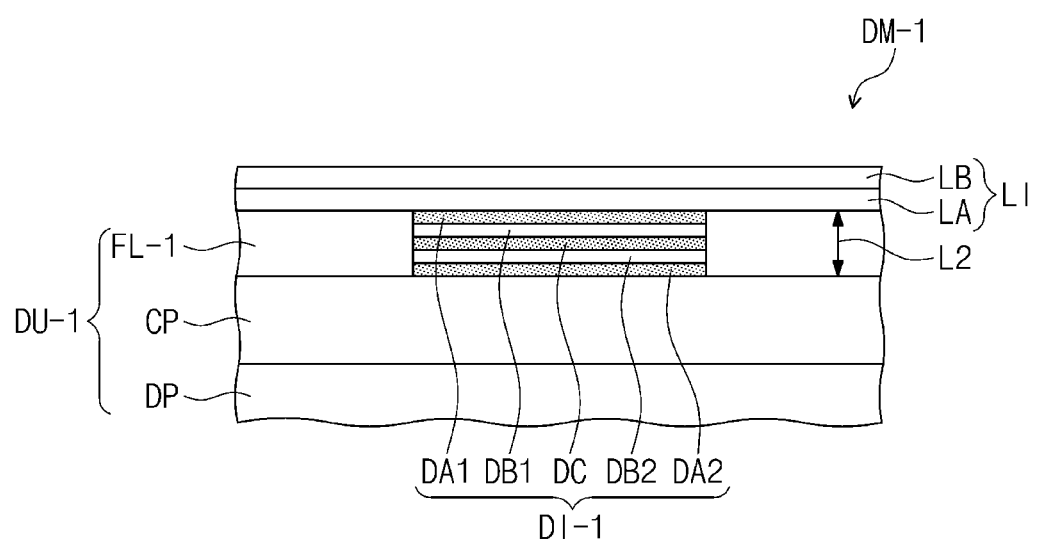
FIG. 8 is a cross-sectional view illustrating components of a display module according to an exemplary embodiment of the present invention.

FIG. 8 is a cross-sectional view illustrating components of a display module according to an exemplary embodiment of the present invention. In the present exemplary embodiment of the present invention, the same components as in the embodiments of FIGS. 6 and 7 are indicated by the same reference designators, and detailed descriptions thereto will be omitted for brevity of description.

A display module DM-1 according to an exemplary embodiment of the present invention may include a display unit DU-1, a step-difference compensation film DI-1 and a protective film LI which are coupled to the display unit DU-1. The display unit DU-1 may include an adhesive film FL-1, the cover panel CP, and the display panel DP.

The adhesive film FL-1 according to an exemplary embodiment of the present invention may have a second thickness L2 greater than a first thickness L1 of the adhesive film FL illustrated in FIG. 7. The thickness of the adhesive film FL-1 in the third direction D3 may be variously changed depending on a height of the power supply unit BT illustrated in FIG. 2.

The step-difference compensation film DI-1, according to an exemplary embodiment of the present invention may include a plurality of intermediate layers DB1 and DB2 and an additional adhesive layer DC. A first intermediate layer DB1 may be disposed between the first adhesive layer DA1 and the additional adhesive layer DC. A second intermediate layer DB2 may be disposed between the additional adhesive layer DC and the second adhesive layer DA2. The plurality of intermediate layers DB1 and DB2 and/or the additional adhesive layer DC may be added or omitted depending on a desired change in thickness of the adhesive film FL-1.

The intermediate layers DB1 and DB2 may include the same material as the intermediate layer DB of FIG. 7. The additional adhesive layer DC may include an acrylic-based adhesive material.

FIGS. 9A to 9D are cross-sectional views illustrating a method of manufacturing a display device, according to an embodiment of the present invention. The same or similar components as described with reference to FIGS. 1 to 7 will be indicated by the same reference designators, and detailed descriptions thereto will be omitted. Hereinafter, a method of manufacturing a display device will be described with reference to FIGS. 9A to 9D.

Figure 9A:
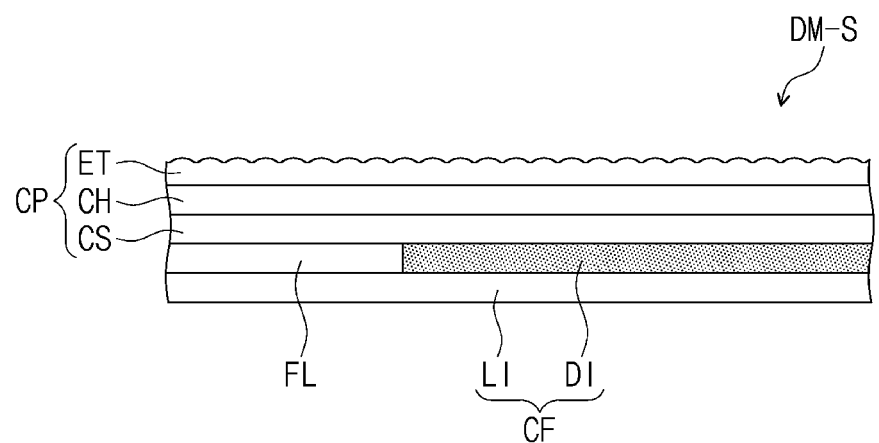
FIGS. 9A to 9D are cross-sectional views illustrating a method of manufacturing a display device, according to an exemplary embodiment of the present invention.

Referring to FIG. 9A, a method of manufacturing a display device according to an exemplary embodiment of the present invention may include providing an initial display module DM-S.

The initial display module DM-S may include a cover panel CP, an adhesive film FL, and a film unit CF. The step-difference compensation film DI of the film unit CF may be provided and coupled on the cover panel CP exposed by the adhesive film FL, and the protective film LI of the film unit CF may be provided and coupled on the step-difference compensation film DI and the adhesive film FL.

Figure 9B:
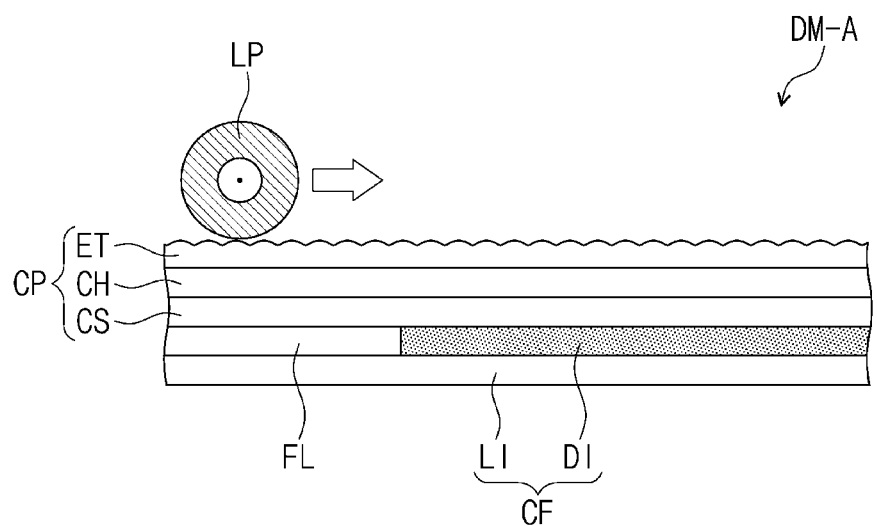

Thereafter, referring to FIG. 9B, the method of manufacturing a display device according to an exemplary embodiment of the present invention may include forming a preliminary display module DM-A. The preliminary display module DM-A may be formed by pressing the initial display module DM-S. The pressing process may be performed using, for example, a roller LP.

According to an exemplary embodiment of the present invention, in the process of pressing the cover panel CP by the roller LP, the step-difference compensation film DI may compensate for a space formed between the adhesive film FL and the cover panel CP, and thus uniform pressure may be applied to the cover panel CP.

Figure 9C:
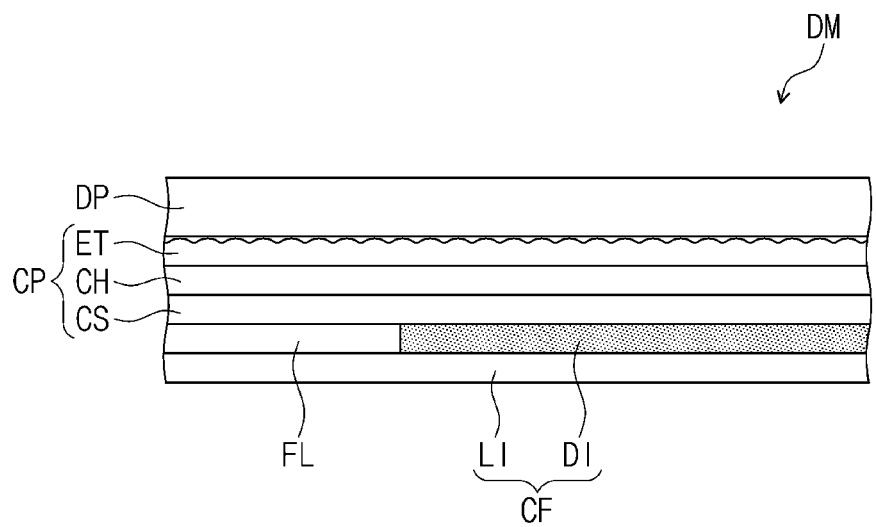

Thereafter, referring to FIG. 9C, the method of manufacturing a display device according to an exemplary embodiment of the present invention may include forming a display module DM. The display module DM may be formed by coupling a display panel DP to the preliminary display module DM-A.

Figure 9D:
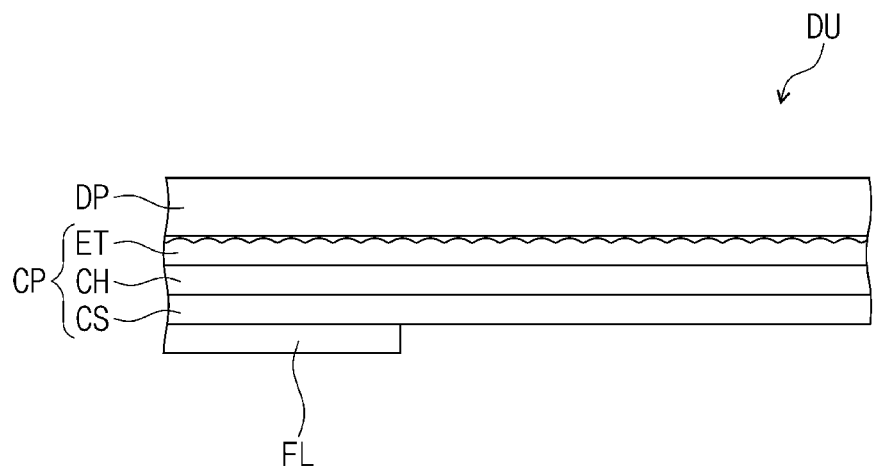

Thereafter, referring to FIG. 9D, the method of manufacturing a display device according to an exemplary embodiment of the present invention may include forming a display unit DU. The display unit DU may be formed by removing the film unit CF from the display module DM.

According to an exemplary embodiment of the present invention, the adhesive strength (e.g., a tensile resistance, a shear resistance, and/or a peel resistance) of the step-difference compensation film DI to the cover panel CP may be less than the adhesive strength of the step-difference compensation film DI to the protective film LI, and the adhesive strength of the step-difference compensation film DI to the protective film LI may be greater than the adhesive strength of the adhesive film FL to the protective film LI. Thus, the film unit CF may be easily separated from the display unit DU in the process of removing the film unit CF.

In addition, the method of manufacturing a display device, according to an exemplary embodiment of the present invention, may further include coupling a cover window WD and a cover case HM to the display unit DU. The cover window WD and the cover case HM may be the same as described with reference to FIGS. 1 and 2. According to an exemplary embodiment of the present invention, the cover case HM may be coupled to the adhesive film FL.

According to exemplary embodiments of the present invention, the film unit may be coupled to the display unit to prevent the display unit from being damaged in a process of receiving, transferring or securing the display unit.

In addition, in the pressing process of coupling the components of the cover panel, the step-difference compensation film may compensate for a space which may occur by a step difference between the adhesive film and the cover panel, and thus uniform pressure may be applied to the cover panel. Furthermore, it is possible to prevent external light from being reflected by a difference in refractive index between the display panel and an air layer filling the space.

While the exemplary embodiments of the present invention have been shown and described above, it will be understood by one of ordinary skill in the art that modifications and variations in form and detail may be made therein without departing from the spirit and scope of the present invention.

What is claimed is:

1. A display module comprising:
   a display panel comprising a pixel configured to display an image on a front surface of the display panel;
   a cover panel disposed on a rear surface of the display panel;
   an adhesive film disposed on the cover panel, wherein the adhesive film exposes a first portion of the cover panel;
   a protective film disposed on the cover panel, wherein the adhesive film is disposed between the protective film and the cover panel; and
   a step-difference compensation film disposed between the cover panel and the protective film,
   wherein the step-difference compensation flint covers the first portion of the cover panel exposed by the adhesive film and the step difference compensation film has a thickness substantially equal to a thickness of the adhesive film.

2. The display module of claim 1, wherein an adhesive strength of the step-difference compensation film to the panel is less than an adhesive strength of the step-difference compensation film to the protective film.

3. The display module of claim 2, wherein the step-difference compensation film comprises:
   a first adhesive layer disposed on the protective film;
   a second adhesive layer disposed on the cover panel; and
   an intermediate layer disposed between the first adhesive layer and the second adhesive layer,
   wherein the adhesive strength of the step-difference compensation film to the protective film is defined as an adhesive strength of the first adhesive layer to the protective film, and
   wherein an adhesive strength of the second adhesive layer of the step-difference compensation film to the cover panel is less than the adhesive strength of the first adhesive layer of the step-difference film to the protective film.

4. The display module of claim 3, wherein the adhesive film comprises:
   a first adhesive film layer disposed on the protective film;
   a second adhesive film layer disposed on the cover panel; and
   an intermediate film disposed between the first adhesive film layer and the second adhesive film layer,
   wherein the adhesive strength of the second adhesive layer of the step-difference compensation film to the cover panel is less than an adhesive strength of the second adhesive film layer of the adhesive film to the cover panel.

5. The display module of claim 4, wherein the adhesive strength of the first adhesive layer of the step-difference compensation film to the protective film is greater than an adhesive strength of the first adhesive film layer of the adhesive film to the protective film.

6. The display module of claim 3, wherein the intermediate layer includes a first intermediate layer and a second intermediate laver, and wherein the step-difference compensation film further comprises an additional adhesive layer disposed between the first intermediate layer and the second intermediate layer.

7. The display module of claim 1, wherein a surface of the step-difference compensation film and a surface of the adhesive film which face the protective film are coplanar with each other.

8. The display module of claim 1, wherein the adhesive film includes at least one opening exposing a second portion of the cover panel which is different from the first portion of the cover panel.

9. The display module of claim 8, wherein the step-difference compensation film comprises:
   a first film covering the first portion of the cover panel; and
   a second film covering the second portion of the cover panel.

10. The display module of claim 1, wherein the adhesive film includes a pressure sensitive adhesive (PSA), an optical clear adhesive (OCA), and/or an optical clear resin (OCR).

11. The display module of claim 1, wherein the cover panel includes a heat dissipation layer, an impact absorbing layer, or a light blocking layer.

12. The display module of claim 1, wherein the first portion of the cover panel exposed by the adhesive film is the heat dissipation layer, the impact absorbing layer or the light blocking layer.

13. A display module comprising:
   a display panel comprising a pixel configured to display an image on a front surface of the display panel;
   a cover panel disposed on a rear surface of the display panel;
   an adhesive film disposed on a rear surface of the cover panel and exposing a first portion of the cover panel,
   a protective film disposed wider the adhesive film; and
   a step-difference compensation film disposed between the cover panel and the protective film and covering the first portion of the cover panel exposed by the adhesive film,
   wherein an adhesive strength of the step-difference compensation film to the cover panel is less than an adhesive strength of the step-difference compensation film to the protective film.

14. The display module of claim 13, wherein a thickness of the step-difference compensation film ranges from 90% to 110% of a thickness of the adhesive film.

15. The display module of claim 14, wherein the adhesive film includes at least one opening exposing a second portion of the cover panel which is different from the first portion of the cover panel, and wherein the step-difference compensation film covers the second portion of the cover panel.

16. The display module of claim 14, wherein the adhesive film comprises:
   a first adhesive film layer ire contact with the protective film;
   a second adhesive film layer in contact with the cover panel; and
   an intermediate film disposed between the first adhesive film layer and the second adhesive film layer,
   wherein the adhesive strength of the step-difference compensation film to the cover panel is less than an adhesive strength of the second adhesive film layer of the adhesive film to the cover panel.

17. The display module of claim 16, wherein the adhesive strength of the step-difference compensation film to the protective film is greater than an adhesive strength of the first adhesive film layer of the adhesive film to the protective film.

* * * * *